United States Patent [19]
Dowler et al.

[11] Patent Number: 5,550,627
[45] Date of Patent: Aug. 27, 1996

[54] EXPOSURE AND PRESSURE APPLICATOR DEVICE FOR PRINTING AN IMAGE

[75] Inventors: James A. Dowler, Greenwood, S.C.; Tyson B. Whitaker, Beavercreek; Julius D. King, Jr., Huber Heights, both of Ohio; Fumitaka Murayama, Okaya, Japan; Satoru Takizawa; Masaao Gomi, both of Suwa, Japan; Fumiyoshi Itoh, Fujimi, Japan

[73] Assignee: Cycolor Imaging, Inc.

[21] Appl. No.: 418,431

[22] Filed: Apr. 6, 1995

[51] Int. Cl.⁶ ............................................. G03G 21/00
[52] U.S. Cl. ........................ 355/326 M; 355/27; 430/138
[58] Field of Search ....................... 355/326 M, 326 P, 355/27; 430/138

[56] References Cited

U.S. PATENT DOCUMENTS

| | | | |
|---|---|---|---|
| 4,416,966 | 11/1983 | Sanders et al. | 430/138 |
| 4,440,846 | 4/1984 | Sanders et al. | 430/138 |
| 4,500,919 | 2/1985 | Schreiber | 358/518 |
| 4,508,807 | 4/1985 | Adair | 430/138 |
| 4,648,699 | 3/1987 | Holycross et al. | 354/297 |
| 4,740,809 | 4/1988 | Yamamoto et al. | 355/27 |
| 4,751,165 | 6/1988 | Rourke et al. | 430/138 |
| 4,766,050 | 8/1988 | Jerry | 430/138 |
| 4,816,846 | 3/1989 | Kollarits | 346/157 |
| 4,842,976 | 6/1989 | Sanders et al. | 430/138 |
| 4,842,981 | 6/1989 | Sanders et al. | 430/138 |
| 4,865,943 | 9/1989 | Wright | 430/138 |
| 4,912,014 | 3/1990 | Feldman | 430/235 |
| 4,935,820 | 6/1990 | Patel et al. | 358/302 |
| 4,992,822 | 2/1991 | Yamamoto et al. | 355/27 |
| 5,028,963 | 7/1991 | Ohashi et al. | 355/27 |
| 5,051,771 | 9/1991 | Kimura et al. | 355/27 |
| 5,128,773 | 7/1992 | Sato | 358/332 |
| 5,140,428 | 8/1992 | Park | 258/244 |
| 5,189,468 | 2/1993 | Sato et al. | 355/88 |
| 5,233,960 | 6/1993 | Kim | 359/54 |

*Primary Examiner*—R. L. Moses
*Attorney, Agent, or Firm*—Thompson Hine & Flory P.L.L.

[57] ABSTRACT

An exposure and pressure applicator device for use in printing an image onto an imaging media, containing photosensitive microcapsules comprising: an exposure means adjacent to the imaging media comprising at least one exposure-producing element which image-wise exposes the imaging media providing a latent image thereon; a pressure applicator means containing at least one point contact element to apply a uniform rupturing force to the exposed imaging media; and motive means for effectuating synchronous movement of both exposure means and pressure applicator means relative to the imaging media, are described.

20 Claims, 3 Drawing Sheets

EXPOSURE AND PRESSURE APPLICATOR DEVICE FOR PRINTING AN IMAGE

BACKGROUND OF THE INVENTION

The present invention generally relates to an exposure and developer device for translating an image from an electronic signal into a latent image on an appropriate photosensitive imaging media and developing the imaging media to provide a full color print of the image.

Imaging systems for recording an image from a video signal are well known and described, for example, in U.S. Pat. Nos. 5,140,428 and 5,223,960 to Goldstar, 5,128,773 and 5,189,468 to Fuji, 4,935,820 to 3M and 4,816,846 to AT&T. Such patents generally teach the use of a liquid crystal display (LCD) and/or a cathode ray tube (CRT) to produce a latent image on a photosensitive medium.

The photosensitive imaging media useful in the imaging systems include the microencapsulated imaging systems developed by the Mead Corporation and described in commonly assigned U.S. Pat. No. 4,399,209. The imaging media is developed by passing the exposed imaging media between a pair of calendar rollers which rupture the microcapsules, thereby allowing contact between the chromogenic material and the developer which react to develop the image. However, even carefully machined metal calendar rollers have uneven surfaces. If the pressure applied to the rollers is insufficient, the surfaces of the rollers may not be in uniform contact with each other over the entire length of the rollers. If the rupturing force is not uniformly distributed, the imaging sheets develop unevenly and the tonal characteristics of the resulting images will not be satisfactory.

Alternate techniques for processing imaging sheets without bulky, high pressure calendar rollers are known. For example, commonly assigned U.S. Pat. No. 4,648,699 describes the development of an imaging sheet containing microcapsules by moving a point contact which is resiliently biased into engagement with the imaging sheet. Typically, the imaging sheet is secured to a cylinder and the point contact is positioned in resilient pressure contact with the imaging sheet. As the cylinder is rotated, the point contact is simultaneously moved along the cylinder in synchronism with the rotation of the cylinder to rupture the microcapsules and develop the image in the imaging sheet, or the imaging sheet may be mounted on a planer platform and the point contact is moved across the surface of the sheet using a screw thread in an X-Y transport device. Also disclosed is an apparatus for developing a continuous web in which the point contact traverses the surface of the web in a variety of patterns; a circular path is illustrated.

While these alternate processing arrangements may be satisfactory for selected applications, there is no teaching of sequentially generating a latent image from an electronic signal and developing the latent image to provide a printed image using an exposure and pressure applicator device; particularly, a device in which the exposure element and the developer element are combined in a single, compact, scanning printer head.

As a result of the continuing interest in the generation of full color prints from electronic signals, a simple, low cost, compact printing device which is inherently reliable and which can translate the electronic signal into corresponding actinic radiation capable of image-wise exposing appropriate imaging sheets, and provide a compatible developing technology which may be integrally combined with the exposure technology is highly desired. None of the previously known systems satisfy these needs.

SUMMARY OF THE INVENTION

In accordance with the present invention, an image, preferably, from an electronic signal is translated into actinic radiation capable of image-wise exposing a suitable photosensitive imaging sheet and said exposed imaging sheet is developed to provide a full color print of the image. The present invention is particularly advantageous where a photosensitive layer comprising microcapsules containing a photosensitive composition in the internal phase is image-wise exposed to actinic radiation and subjected to a uniform rupturing force whereupon the microcapsules rupture and image-wise release the internal phase which reacts with a developer material to produce an image therein.

According to one embodiment of the invention, there is described a device which comprises an exposure head for exposing the imaging sheet, a pressure applicator head for developing the exposed imaging sheet, and motive means to effect synchronous movement of the exposure means and the pressure applicator means relative to the imaging media. In accordance with this embodiment, the device comprises: an exposure and pressure applicator device for use in printing an image, preferably, from a electronic signal onto an imaging media containing photosensitive microcapsules. The device comprises an exposure means positioned adjacent to said imaging media, said exposure means comprising at least one exposure-producing element which image-wise exposes said imaging media to provide a latent image thereon; a pressure applicator means containing at least one point contact element to apply at least one point of uniform rupturing force to said exposed imaging media; and motive means for effectuating synchronous movement of both said exposure means and said pressure applicator means relative to said imaging media.

In one manifestation of the invention, the exposure-producing elements comprise modulated red, green and blue light emitting diodes which receive the electronic signals and emit corresponding actinic radiation to imagewise direct light onto the imaging sheet.

In another manifestation of the invention, the exposure-producing elements comprise one or more modulated liquid crystal display panels in combination with one or more light sources which receive the electronic signals and emit corresponding actinic radiation to image-wise direct light onto the imaging sheet.

In another manifestation of the invention, the point contact element is a spherical element or a plurality of spherical elements which are arranged such that each element provides a distinct lateral path which is parallel to the lateral paths of adjacent spherical elements and slightly off-set so that the paths overlap but are not superposed upon one another. For example, the multiple contact elements may be arranged along a linear line which is slightly oblique to the lateral axis of the pressure applicator head, or they may be arranged along a non-linear line, (e.g. circular, oval, zigzag etc.), or they may be arranged in any other desirable pattern.

In accordance with a preferred manifestation of the invention, the exposure and pressure applicator device for use in printing an image onto an imaging media comprises exposure means and pressure applicator means combined into a single unit, wherein the exposure means comprises at least one exposure-producing element for receiving and translating an electronic signal (corresponding to an image) into actinic radiation which image-wise exposes the imaging media to provide a latent image thereon, and the pressure applicator means comprises at least one point contact element for continuously contacting the exposed imaging media to develop the latent image forming the visual image thereon.

According to another embodiment of the invention, there is described an exposure and pressure applicator device for use in printing an image onto an imaging media containing photosensitive microcapsules, said device comprising a compact scanning printer head which comprises exposure means and pressure applicator means combined therein as a single unit wherein said exposure means comprises at least one exposure producing element which image-wise exposes said imaging media to provide a latent image thereon, and said pressure applicator means comprises at least one point contact element to apply at least one point of uniform rupturing force to said exposed imaging media; and motive means for effectuating movement of said compact scanning printer head relative to said imaging media.

While the present device represents an important advancement in the art, the specific printer head which combines the exposure means and developer means into a compact, low cost and efficient printer head unit represents a particularly significant advantage in printing from electronic signals.

Particular aspects of the invention will become apparent from the following description, the accompanying drawings, and the appended claims.

DETAILED DESCRIPTION OF THE INVENTION

Referring to the accompanying drawings, a detailed description will be given for an apparatus and method for exposing and developing an image received from an electronic signal onto an imaging sheet.

Figure 1:
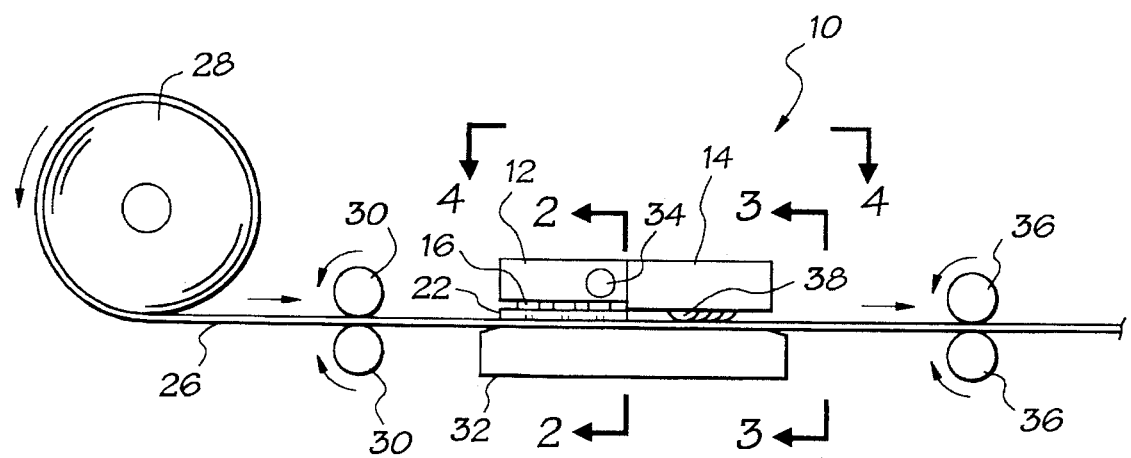
FIG. 1 is a diagrammatic sectional side view of a scanning exposure and pressure applicator apparatus according to one embodiment of the present invention.

FIG. 1 is a diagrammatic side view of a combined scanning exposure and pressure applicator apparatus 10 containing an exposure head 12 and a pressure applicator head 14. The apparatus 10 is preferably enclosed in a housing structure (not shown). The exposure head 12 contains a plurality of modulated exposure producing elements 16 which may be in the form of light emitting diodes (LED), liquid crystal display (LCD) panels, lasers, fiber optics, etc. Preferably the exposure producing elements are red, green and blue LED's mounted in the exposure head 12. The exposure producing elements 16 are activated by energy preferably received from an electronic signal to provide a source of actinic radiation which is directed to an imaging sheet 26, e.g., through a beam-forming aperture plate 22 positioned adjacent to the LED's 16 where the actinic radiation is projected onto the imaging sheet 26.

The imaging sheet 26, in the form of a continuous web, is typically supplied from a supply roll 28 and transported by feed rollers 30 powered by a motor (not shown) along a longitudinal path in the direction of the arrow to the exposure head 12. The second pair of rollers 36 may or may not be powered by a motor. It is conceivable that the second pair of rollers 36 are powered by a motor and the first set of rollers 30 act as non-powered guide rollers. As the imaging sheet 26 passes between the beam-forming aperture plate 22 and support plate 32, a driving system, as more fully described below, causes the exposure head 12, to oscillate laterally on a carriage rail 34 across the imaging sheet 26 to form a latent image thereon. After exposure, the imaging sheet 26 is transported, in one aspect of the invention, to the developer area where the exposed imaging sheet 26 is passed between the pressure applicator head 14 and the support plate 32 to develop the exposed imaging sheet 26. After the exposed imaging sheet 26 is developed, the web may be cut transversely using a cutting means (not shown) to provide an individual sheet containing the desired image. In another aspect of the invention, the exposure head 12 and the pressure applicator head 14 not only oscillate laterally across the imaging media but also traverse through the imaging media in the machine direction longitudinally in a stepwise manner.

The pressure applicator head 14 comprises at least one point contact element 38 and, preferably, a plurality of such point contact elements. The pressure applicator head 14 oscillates laterally across the exposed imaging sheet 26 so that the point contact elements 38 provide a plurality of overlapping lateral paths across the exposed imaging sheet 26. The pressure exerted on the exposed imaging sheet 26 by the point contact elements 38 as they traverse the exposed imaging sheet 26 causes the unexposed microcapsules to rupture thereby allowing the image-forming material to contact the developer material and develop the exposed imaging sheet 26 to form a print of the image thereon. Movement of the advancing imaging sheet 26 in the machine direction may be continuous or in a stepwise manner and is synchronized with the lateral oscillation of the combined scanning exposure and pressure applicator apparatus 10; or the imaging media 26 may be stationary as indicated above, in which case the exposure head 12 and the pressure applicator head 14 not only oscillate laterally across the imaging media but also traverse the media in the machine direction in a stepwise manner to expose and develop the imaging media.

The drive system which causes the exposure head 12 and the pressure applicator head 14 to oscillate across the imaging media is any device which influences the exposure head 12 and the pressure applicator head 14 to oscillate. Typically, the drive system comprises but is not limited to a continuous motor, a step motor, programmed motors, and the like. The motor which causes the exposure head and the pressure applicator head, or the imaging media, to move in the machine direction may be the same motor which oscillates the exposure head and pressure applicator head laterally or a different motor may be used.

Figure 2:
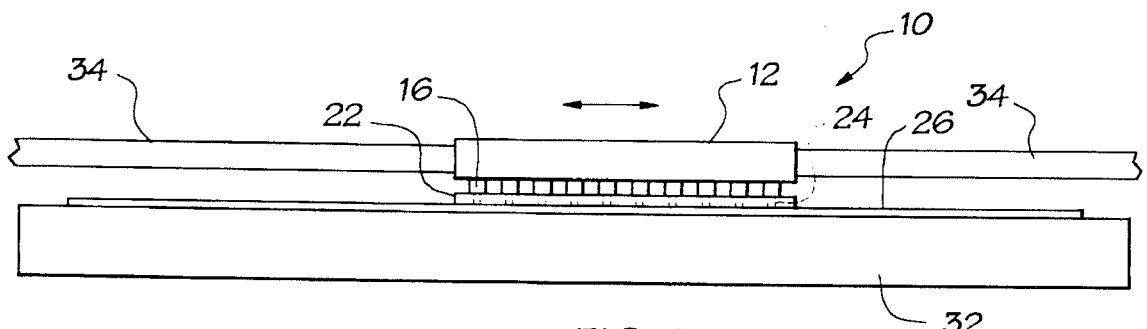
FIG. 2 is a diagrammatical sectional end view of the scanning exposure and pressure applicator apparatus of FIG. 1 taken along lines 2—2.

FIG. 2 is a diagrammatical cross-sectional view of the exposure head 12 of the scanning combined exposure and pressure applicator apparatus 10 taken along lines 2—2'. The exposure head 12 oscillates laterally across the imaging sheet 26 on a carriage rail 40 to expose the imaging sheet 26 and provide a latent image thereon. After exposure of the imaging sheet 26, the latent image formed on the exposed imaging sheet 26 is developed by the pressure applicator head 14 to provide a print, preferably, a full color print, of the image.

Figure 3:
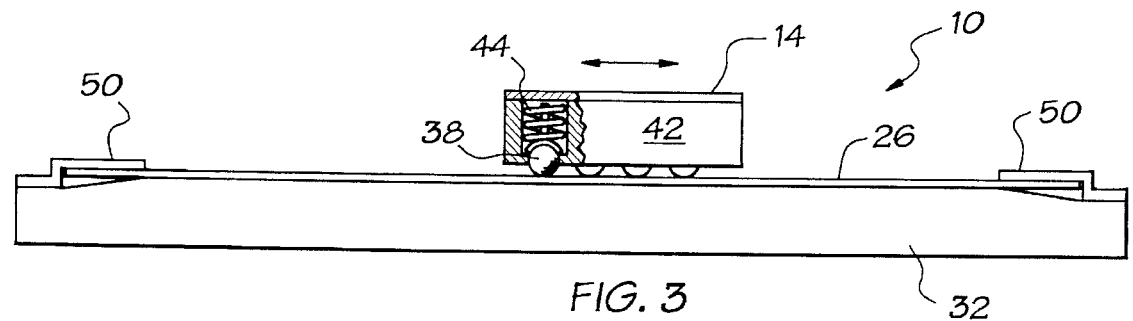
FIG. 3 is a diagrammatical sectional end view of the scanning exposure and pressure applicator apparatus of FIG. 1 taken along lines 3—3.

FIG. 3 is a diagrammatical cross-sectional view of the pressure applicator head taken along lines 3—3'. A section of the end wall 42 of the pressure applicator head 14 is shown broken away to partially expose the point contact element 38 and the associated pressure regulating means which is illustrated as a compression spring 48. The pressure applicator head 14 oscillates across the exposed imaging sheet 26 in parallel motion with the exposure head 12 and, preferably is synchronized therewith using a common drive motor, programmed servo motors, or the like. At the end of the pivotal point of each oscillation, the pressure applicator head 14 may be disengaged from contact with the imaging sheet 26 at its lateral edges by a disengaging means 50 so that the point contact element 38 is prevented from rupturing the microcapsules in the border region of the imaging sheet 26.

As mentioned earlier, the exposure head 12 and the pressure applicator head 14 may be operated independently and separately; however, in a preferred manifestation of the invention, the exposure head 12 and the applicator head 14 are combined into a single scanning exposure and pressure applicator apparatus 10 containing the exposure producing elements 16 in a forward arrangement with respect to the point contact elements 38.

Figure 4:
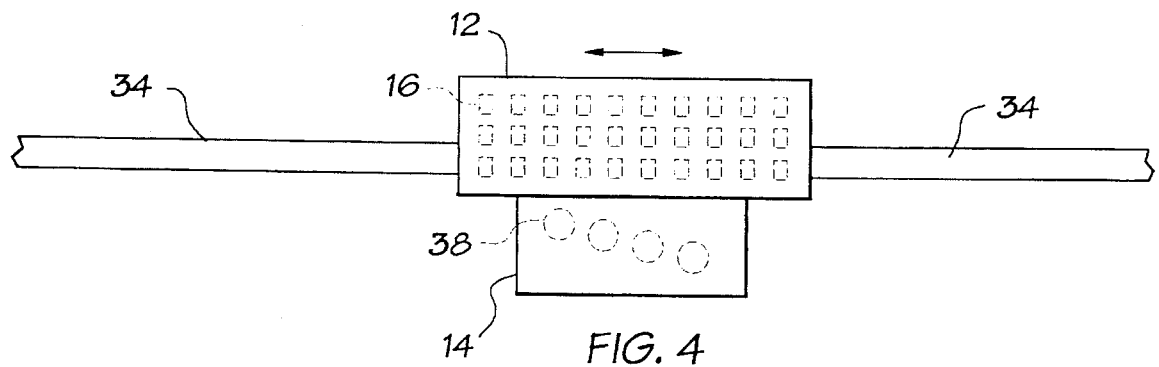
FIG. 4 is a diagrammatical sectional top view of the scanning exposure and pressure applicator apparatus of FIG. 1 taken along lines 4—4.

FIG. 4 is a diagrammatical view of the combined scanning exposure and pressure applicator apparatus 10 taken along lines 4 and 4 showing a plurality of exposure producing elements 16 (illustrated as LED's) in the front section of the combined scanning exposure and pressure applicator apparatus 10 which is partially cut away to expose the point contact elements 38 in the rear section of the apparatus 10. In this arrangement, the exposure head 12 continuously exposes the imaging sheet 26 along the paths provided by the oscillating exposure head 12 to define a latent image on the imaging sheet while the pressure applicator head 14 subsequently develops the image as the pressure applicator head 14 traverses the exposed imaging sheet.

Figure 5:
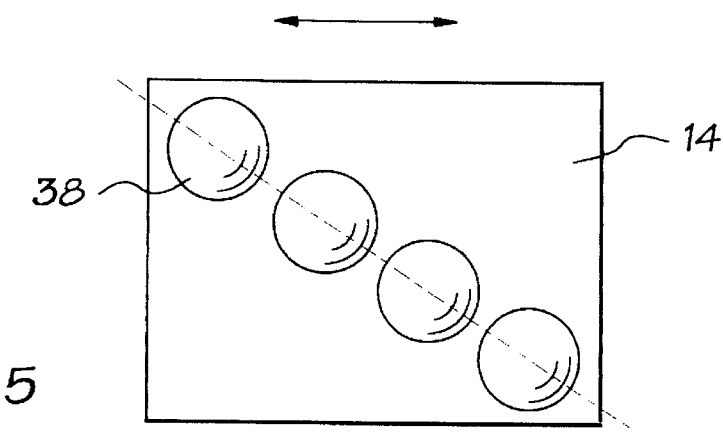
FIGS. 5–7 are diagrammatical sectional top views of a pressure applicator apparatus, further illustrating various configurations of the point contact elements.
Figure 6:
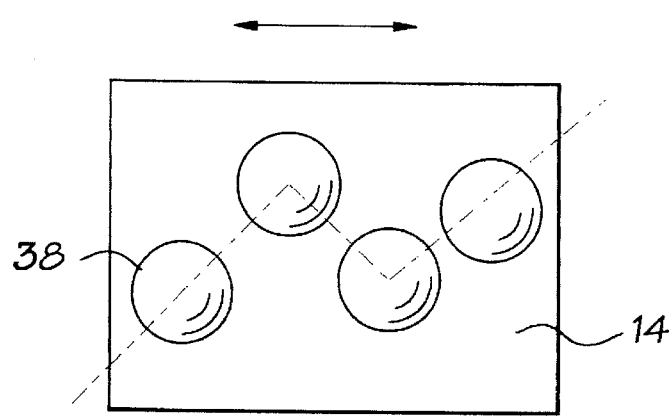
Figure 7:
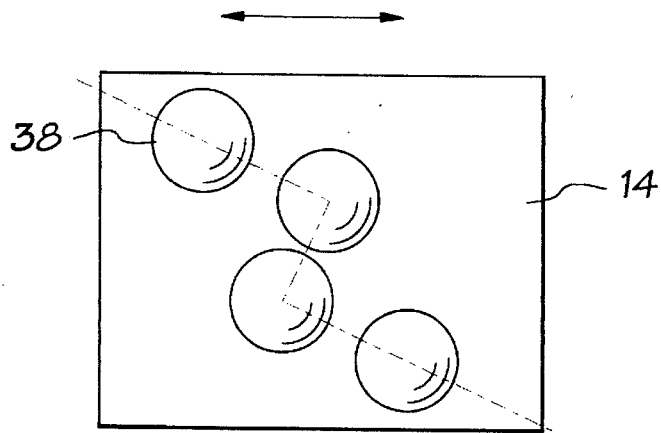

FIG. 5 illustrates a pressure applicator head 14 in which the point contact elements 38 are arranged in a linear line oblique to the lateral axis of the pressure applicator head 14. FIGS. 6 and 7 illustrate variation of FIG. 5 in which the point contact elements 38 are arranged in non-linear lines which are in a zigzag configuration in lateral and longitudinal orientations, respectfully. Other configurations are possible such as a circular arrangement of the point contact elements 38 with respect to the applicator head 14.

Figure 8:
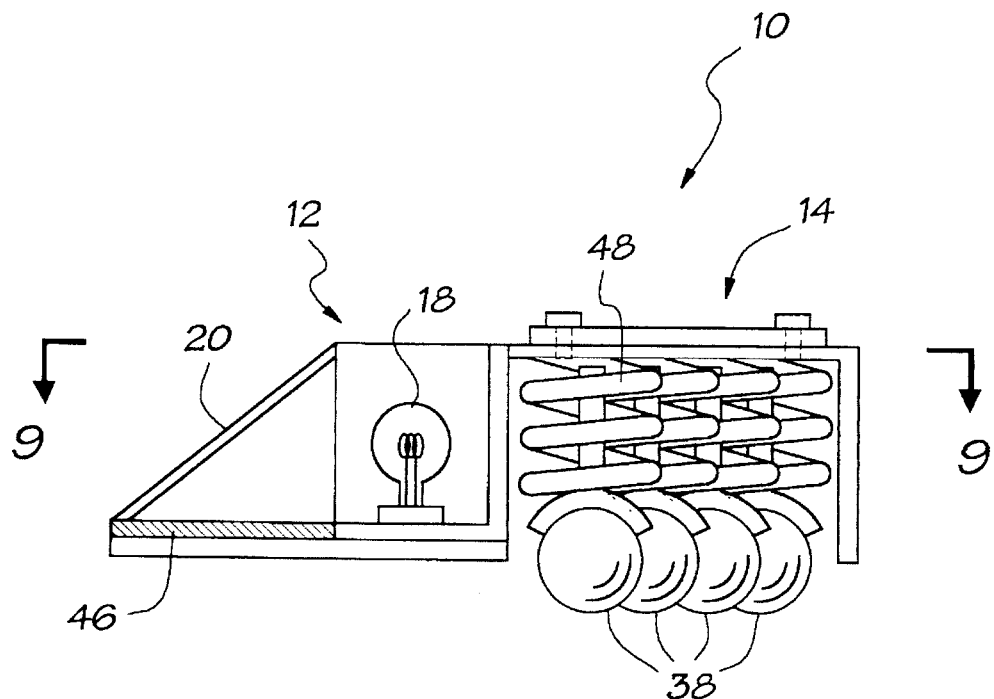
FIG. 8 is a diagrammatic sectional side view of a combined exposure/pressure applicator apparatus according to a preferred embodiment of the invention.
Figure 9:
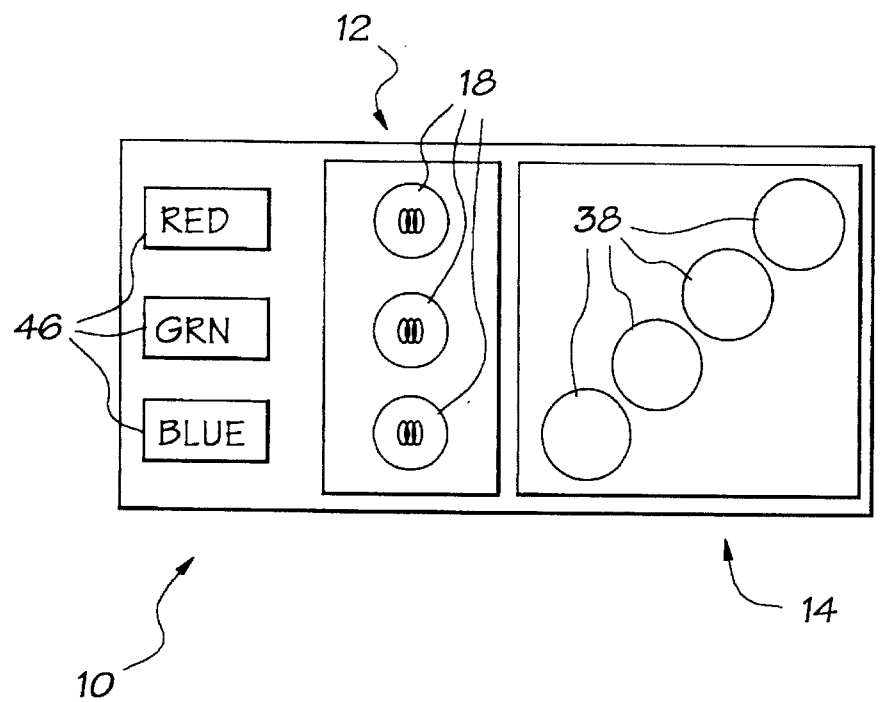
FIG. 9 is a diagrammatic sectional top view of the combined exposure/pressure applicator apparatus of FIG. 8 taken along lines 9—9.

FIGS. 8 and 9 are a diagrammatical side view and a diagrammatical top view taken along lines 9 and 9', respectively of a compact combined exposure and pressure applicator apparatus 10 in accordance with another aspect of the invention wherein the exposure producing elements 16 in exposure head 12 are liquid crystal display (LCD) panels and the point contact elements 38 in pressure applicator head 14 are illustrated as spherical elements under pressure from compression springs 48. The light source 18 provides radiation λ which is reflected off a mirror 20 through the LCD's 16 (FIG. 8).

The prints obtained in accordance with the present invention may be black and white prints, monochromic prints or full color prints produced on a photosensitive imaging sheet which may be supplied from a continuous roll of web material or preferably as an individual sheet, e.g., the sheet may be fed by hand or from a cassette/package containing individual sheets.

For aesthetic effects it may be desirable to provide a border around the perimeter of the print obtained. The border which is preferably white may be obtained by: providing a strip of tape or similar material along each of the lateral edges of the imaging sheet 26, pre-exposing the edges of the imaging sheet, coating the imaging sheet 26 such that the microcapsules and/or the developer material is contained selectively in the desired image area, etc. In accordance with one aspect of the present invention, the borders along the lateral edges of the print are obtained by providing an overhanging border rail 50 (FIG. 3) formed from a thin material such as metal, plastic, etc. attached at each lateral edge of the apparatus 10. As the pressure applicator head 14 oscillates across the imaging sheet 26 and approaches the lateral edges of the imaging sheets, it contacts and rides upon the border rail 50 where it is displaced from intimate contact with the imaging sheet and, therefore, is prevented from developing the lateral edges of the imaging sheet. Another disengaging means (not shown) may also be employed to displace the point contact elements 38 from intimate contact with the imaging sheet 26 at the leading and trailing edges of the print to provide leading and trailing non-developed borders.

The invention is particularly useful in printing an image obtained from a electronic signal onto a self-contained imaging sheet such as described copending U.S. patent application Ser. No. 08/258,329, filed Jun. 10, 1994. Such self-contained imaging sheet typically comprises in order: a first transparent substrate, an imaging composition containing photohardenable microcapsules and a color former, a developer material, a layer of adhesive and a second substrate which may or may not contain an opacifying agent. The microcapsules and developer material may be in the same layer or contained in the imaging sheet as separate layers.

In addition to the imaging sheets specifically described above, other imaging sheets may be advantageously employed in carrying out the present invention as will be apparent to those skilled in the art. For example, the combined exposure and pressure applicator apparatus 10 of the invention may be used or modified for use in the exposure and development of an image onto the imaging sheets described in commonly assigned U.S. Pat. Nos. 4,399,209; 4,416,966; 4,440,846; 4,751,165; 4,766,050; 4,842,981; 4,842,976; 4,865,943; and 4,912,014.

The exposure-producing elements are typically mounted on the exposure head, however, one may find it desirable to place the exposure-producing elements or, at least a portion of the exposure-producing elements, such as the radiation source, at a location removed from the exposure head. For example, fiber optic cables could be mounted such that they are attached at one end to a remote stationary light source with the other end attached to the moving exposure head, or separate radiation sources such as one or more lasers maybe mounted remote from the exposure head which carries one or more small mirrors or other devices to direct the radiation beam onto the imaging media during scanning.

The light beam from the exposure producing elements can be directed to the imaging sheet by any known means such as colored filers, lens, etc., or the light may be directed to the imaging sheet as a laser beam. Preferably, a beam-forming plate having a plurality of apertures in spatial correspondence with the light source is employed to direct the light to the imaging sheet.

The exposure producing elements useful in this invention are any elements or other sources of radiation which are capable of producing modulated light in an array of colors or the light from the exposure producing elements such as light emitting diodes, liquid crystal display panels or projectors, cathode ray tubes, fiber optics, lasers, light bulbs, etc. may pass through a color producing element, e.g., lenses, crystals, LCD's, etc. The light from the exposure producing elements may be time modulated, intensity modulated, etc. to produce any number or variety of colors. Preferably, the light producing elements are time modulated LED's and, most preferably, colored LED's. Satisfactory colored prints have been obtained using red, green and blue LED's.

While a variety of manifestations have been disclosed for performing point contact development, many other arrangements will be apparent to those skilled in the art after a review of the above disclosure.

The imaging system described above is especially suitable for use in the present invention for exposure using a liquid crystal array or light emitting diodes driven by an electronic signal for the reproduction of images from a video cassette recorder, a camcorder, or the like.

Having described the invention in detail and by reference to preferred aspects thereof, it will be apparent that modifications and variations are possible without departing from the scope of the invention defined in the appended claims.

What is claimed is:

1. An exposure and pressure applicator device for use in printing an image onto an imaging media containing photosensitive microcapsules, said device comprising:

an exposure means positioned adjacent to said imaging media, said exposure means comprising at least one exposure-producing element which image-wise exposes said imaging media to provide a latent image thereon;

a pressure applicator means to apply at least one point of uniform rupturing force to said exposed imaging media; and motive means for effectuating synchronous movement of both said exposure means and said pressure applicator means relative to said imaging media wherein said motive means causes both said exposure means and said pressure applicator means to oscillate across said imaging media.

2. The device of claim 1 wherein said pressure applicator means contains at least one point contact element to apply said at least one point of uniform rupturing force to said exposed imaging media.

3. The device of claim 2 wherein said motive means causes both said exposure means and said pressure applicator means to oscillate laterally across said imaging media.

4. The device of claim 3 wherein said imaging media is stationary and said motive means causes both said exposure means and said applicator means to traverse said stationary imaging media stepwise in the machine direction.

5. The device of claim 3 wherein said motive means causes said imaging media to move stepwise in the machine direction.

6. The device of claim 2 wherein said at least one exposure-producing element is selected from the group consisting of one or more modulated light emitting diodes, modulated liquid crystal display components, lasers, and fiber optic cables.

7. The device of claim 5 wherein said at least one exposure-producing element is one or more modulated light emitting diodes.

8. The device of claim 2 wherein said at least one point contact element comprises a plurality of point contact elements, wherein said plurality of point contact elements are arranged so that each element provides a lateral path which is parallel to and slightly off-set from the lateral paths of adjacent elements.

9. The device of claim 8 wherein said plurality of point contact elements are arranged along a linear line, wherein said linear line is oblique with respect to the lateral axis of said pressure applicator means.

10. The device of claim 8 wherein said plurality of point contact elements are arranged along a non-linear line.

11. The device of claim 2 wherein said pressure applicator means further comprises a pressure regulating means.

12. The device of claim 11 wherein said pressure regulating means is a compression spring.

13. The device of claim 2 wherein said exposure means and said pressure applicator means are contained in a single, compact unit.

14. The device of claim 2 wherein said device further comprises a beam-forming aperture plate adjacent to said exposure means.

15. The device of claim 14 wherein said beam-forming aperture plate contains a plurality of apertures corresponding to and aligned with said exposure producing elements.

16. The device of claim 15 wherein each of said apertures contains a colored filter, said colored filter providing a colored beam of light from said exposure producing elements.

17. The device of claim 2 wherein said device further comprises a disengaging means for disengaging said pressure applicator means from said imaging media near the pivotal point of each oscillation of said pressure applicator means to displace the point contact element from contact with the imaging media at the lateral edges of said imaging media, thereby preventing rupture of the microcapsules in the lateral edges.

18. The device of claim 2 wherein said device further comprises a disengaging means for disengaging said pressure applicator means from said imaging media at the leading and trailing edges of the imaging media to displace the point contact element from contact with the imaging media at the leading and trailing edges of said imaging media, thereby preventing rupture of the microcapsules in the leading and trailing edges.

19. An exposure and pressure applicator device for use in printing an image onto an imaging media containing photosensitive microcapsules, said device comprising:

a compact scanning printer head which comprises exposure means and pressure applicator means combined therein as a single unit wherein said exposure means comprises at least one exposure producing element which image-wise exposes said imaging media to provide a latent image thereon, and said pressure applicator means comprises at least one point contact element to apply at least one point of uniform rupturing force to said exposed imaging media; and motive means for effectuating movement of said compact scanning printer head relative to said imaging media.

20. A compact scanning printer head for printing an image onto an imaging media, wherein said compact scanning printer head comprises exposure means and pressure applicator means combined into a single unit, said exposure means comprising at least one exposure producing element which image-wise exposes said imaging media to provide a latent image on said imaging media, and said pressure applicator means comprises at least one point contact element for contacting the exposed imaging media to develop said latent image forming a visual image on said imaging media.

* * * * *